(12) United States Patent
Hung

(10) Patent No.: US 10,978,870 B2
(45) Date of Patent: Apr. 13, 2021

(54) ELECTROSTATIC DISCHARGE PROTECTION DEVICE

(71) Applicant: MACRONIX International Co., Ltd., Hsinchu (TW)

(72) Inventor: Tzu-Yi Hung, Kaohsiung (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 133 days.

(21) Appl. No.: 16/380,885

(22) Filed: Apr. 10, 2019

(65) Prior Publication Data

US 2020/0328592 A1  Oct. 15, 2020

(51) Int. Cl.
*H01L 27/02* (2006.01)
*H02H 9/04* (2006.01)

(52) U.S. Cl.
CPC ......... *H02H 9/046* (2013.01); *H01L 27/0248* (2013.01); *H01L 27/0259* (2013.01)

(58) Field of Classification Search
CPC ........ H02H 9/046; H02H 9/045; H02H 9/025; H02H 9/04; H02H 9/041; H01L 27/0266; H01L 27/0255; H01L 27/0288; H01L 27/0248; H01L 27/0274; H01L 27/0285; H01L 27/0292; H01L 29/0847; H01L 23/60; H01L 23/5226; H01L 2924/00; H01L 2924/00012; H01L 2924/00014
See application file for complete search history.

(56) References Cited

U.S. PATENT DOCUMENTS

2018/0033878 A1* 2/2018 Tailliet ............... H01L 29/7408

* cited by examiner

*Primary Examiner* — Bryan R Perez
(74) *Attorney, Agent, or Firm* — J.C. Patents

(57) ABSTRACT

An electrostatic discharge protection device includes a substrate, a high-voltage N-well region, and a high-voltage P-well region. The substrate includes a first area and a second area which surrounds the first area. The first area is disposed on the high-voltage N-well region and includes a first doped region having a first conductivity type, a second doped region having a second conductivity type which surrounds the first doped region, and a third doped region having the first conductivity type which surrounds the second doped region. The second area is disposed on the high-voltage P-well region and includes a plurality of fourth doped regions having the second conductivity type and a fifth doped region having the first conductivity type. The plurality of fourth doped regions are arranged at intervals and surround the first area. The fifth doped region surrounds the first area and each of the plurality of fourth doped regions.

10 Claims, 6 Drawing Sheets

ELECTROSTATIC DISCHARGE PROTECTION DEVICE

BACKGROUND OF THE INVENTION

Field of the Invention

The invention relates to a semiconductor device, and more particularly, to an electrostatic discharge protection device having an electrostatic discharge protection function.

Description of Related Art

High-voltage electrostatic discharge (ESD) devices designed with the triple-well process have been widely used. Among the devices used for high-voltage ESD protection, high-voltage MOSFET (metal-oxide-semiconductor field-effect transistor) devices usually have low on-resistance (Rdson) characteristics, so during an ESD event, the ESD current may concentrate on the surface of the device or the edge of the drain, thus causing high currents and high electric fields to physically destroy the junction area of the device. Also, based on low on-resistance (Rdson) requirements, surface or lateral layout design rules are generally not changed due to ESD protection performance in high-voltage processes. However, the ESD protection performance of high-voltage ESD devices typically depends on the overall width, surface, and lateral layout design rules.

In terms of ESD protection, high-voltage ESD devices generally have a high breakdown voltage, but the trigger voltage of a high-voltage ESD device is usually much higher than the breakdown voltage. Thus, during an ESD event, the protected devices or internal circuitry typically carry a risk of damage before the high-voltage ESD device is triggered for ESD protection. Conventional techniques design additional ESD detection circuits to reduce the trigger voltage, but ESD detection circuits increase the layout area. Moreover, adding additional masks and steps to the process to reduce the trigger voltage increases manufacturing costs.

SUMMARY OF THE INVENTION

In view of the above, the invention provides a semiconductor device capable of manufacturing an electrostatic discharge protection device having a low trigger voltage, a high withstand current, and a small layout area by using an existing triple-well process.

An embodiment of the invention provides an electrostatic discharge protection device, wherein the electrostatic discharge protection device includes, but is not limited to, a substrate, a high-voltage N-well region, and a high-voltage P-well region. The substrate has a first area and a second area, the second area surrounds the first area, and the substrate has a first conductivity type. The high-voltage N-well region has a second conductivity type and is disposed on the substrate, and the high-voltage P-well region has the first conductivity type and is disposed on the high-voltage N-well region. The first area is disposed on the high-voltage N-well region, and the first area includes a first doped region, a second doped region, and a third doped region. The first doped region has the first conductivity type, the second doped region has the second conductivity type and surrounds the first doped region, and the third doped region has the first conductivity type and surrounds the second doped region. The second area is disposed on the high-voltage P-well region, and the second area includes a plurality of fourth doped regions and a fifth doped region. The plurality of fourth doped regions have the second conductivity type, and the plurality of fourth doped regions are arranged at intervals and surround the first area. The fifth doped region has the first conductivity type, and the fifth doped region surrounds the first area and each of the plurality of fourth doped regions.

Based on the above, the invention provides an electrostatic discharge protection device having a low trigger voltage. An N+ doped region and a P+ doped region having a ring structure are disposed outside the P+ doped region in the high-voltage N-well region, and a plurality of the N+ doped region surrounded by the P+ doped region and arranged at intervals are disposed in the high-voltage P-well region surrounding the high-voltage N-well region to provide a plurality of parasitic bipolar transistors in an electrostatic discharge path, thus further reducing the trigger voltage of the electrostatic discharge protection device and improving the electrostatic discharge protection capability.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following embodiments, the first conductivity type is P-type, and the second conductivity type is N-type as an example, but the invention is not limited thereto. In another embodiment, the first conductivity type may be N-type, and the second conductivity type may be P-type.

Figure 1:
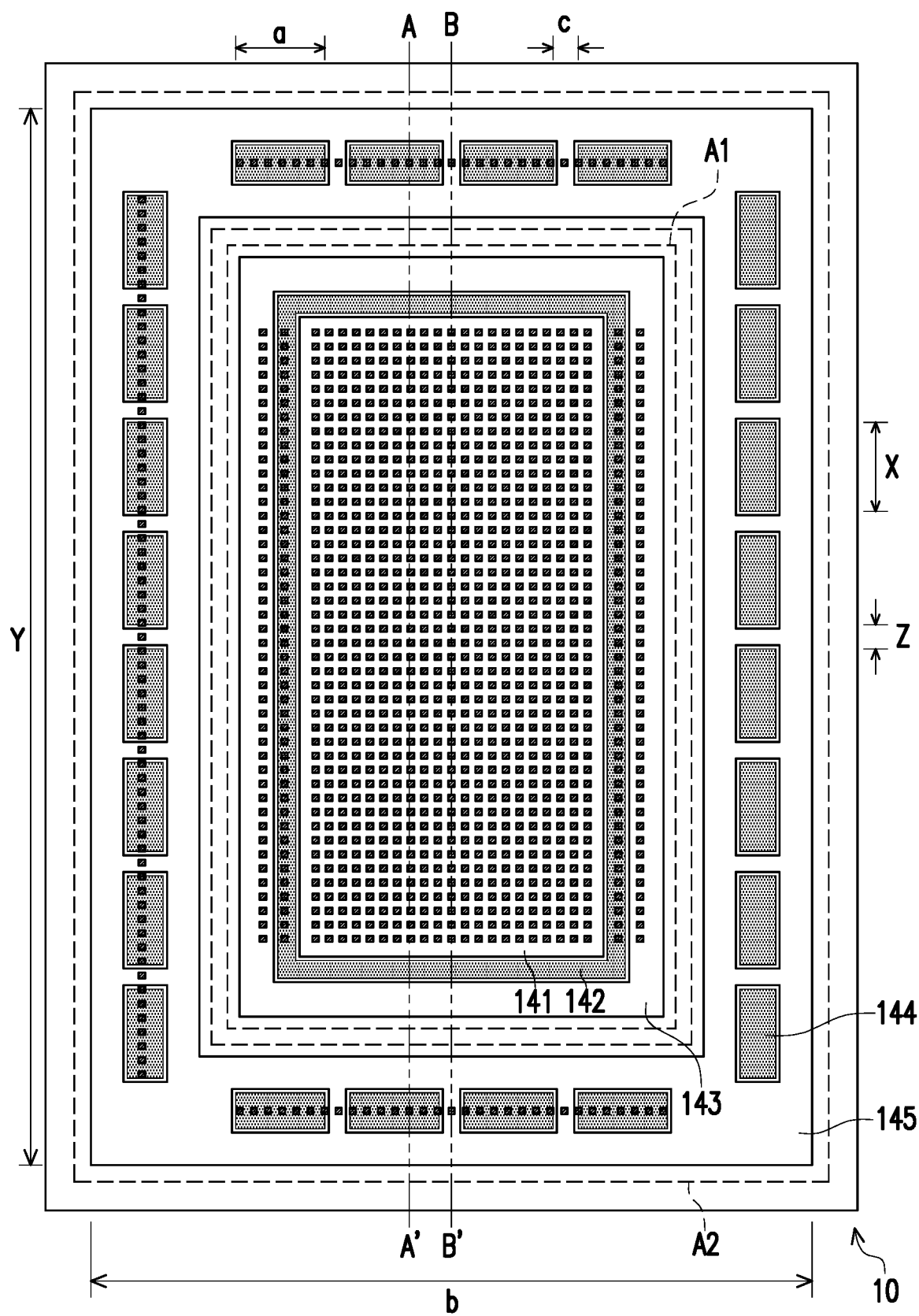
FIG. 1 is a simplified top view of an electrostatic protection circuit shown according to an embodiment of the invention.
Figure 2:
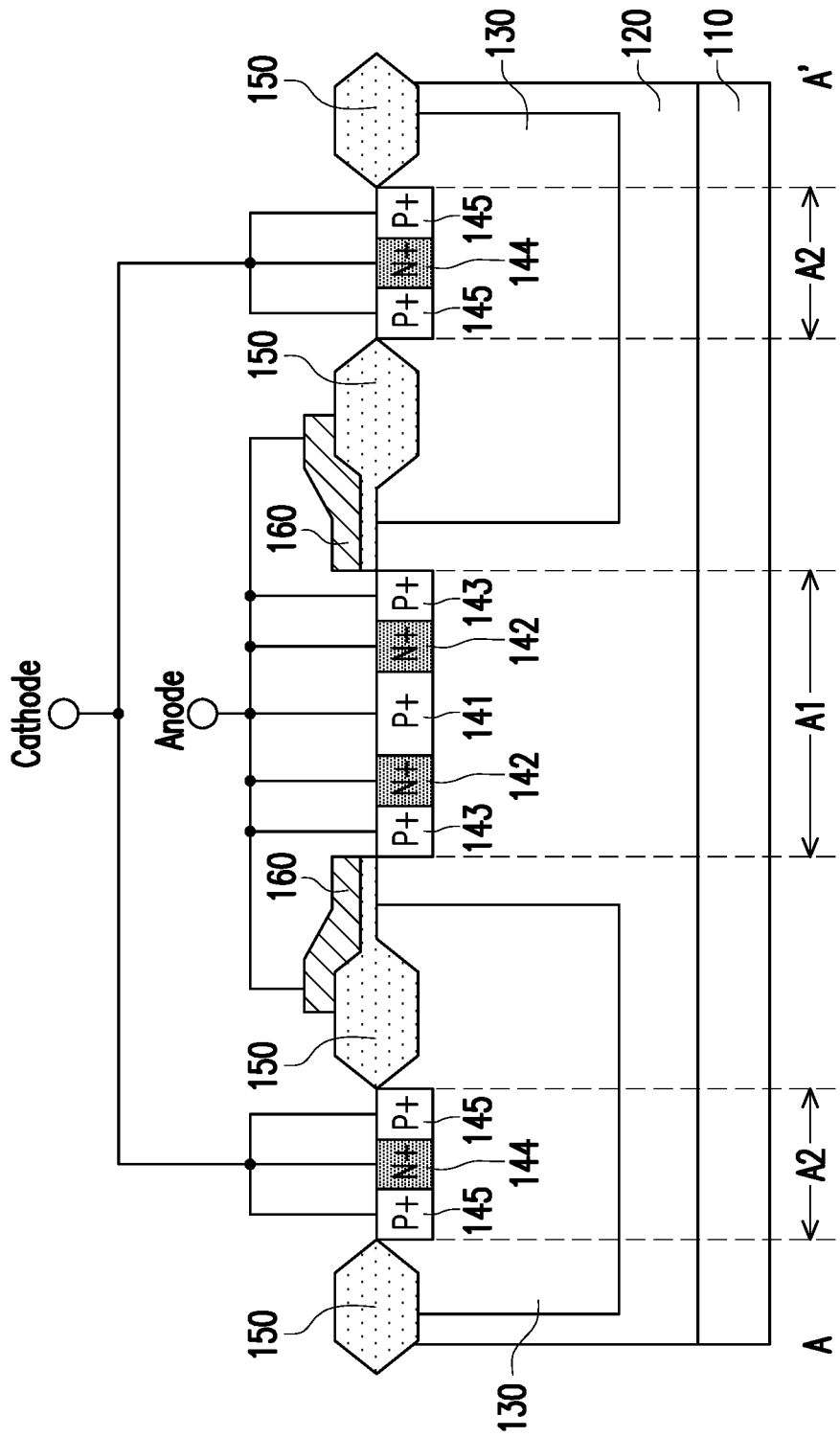
FIG. 2 is a cross section shown along section line A-A' of FIG. 1.
Figure 3:
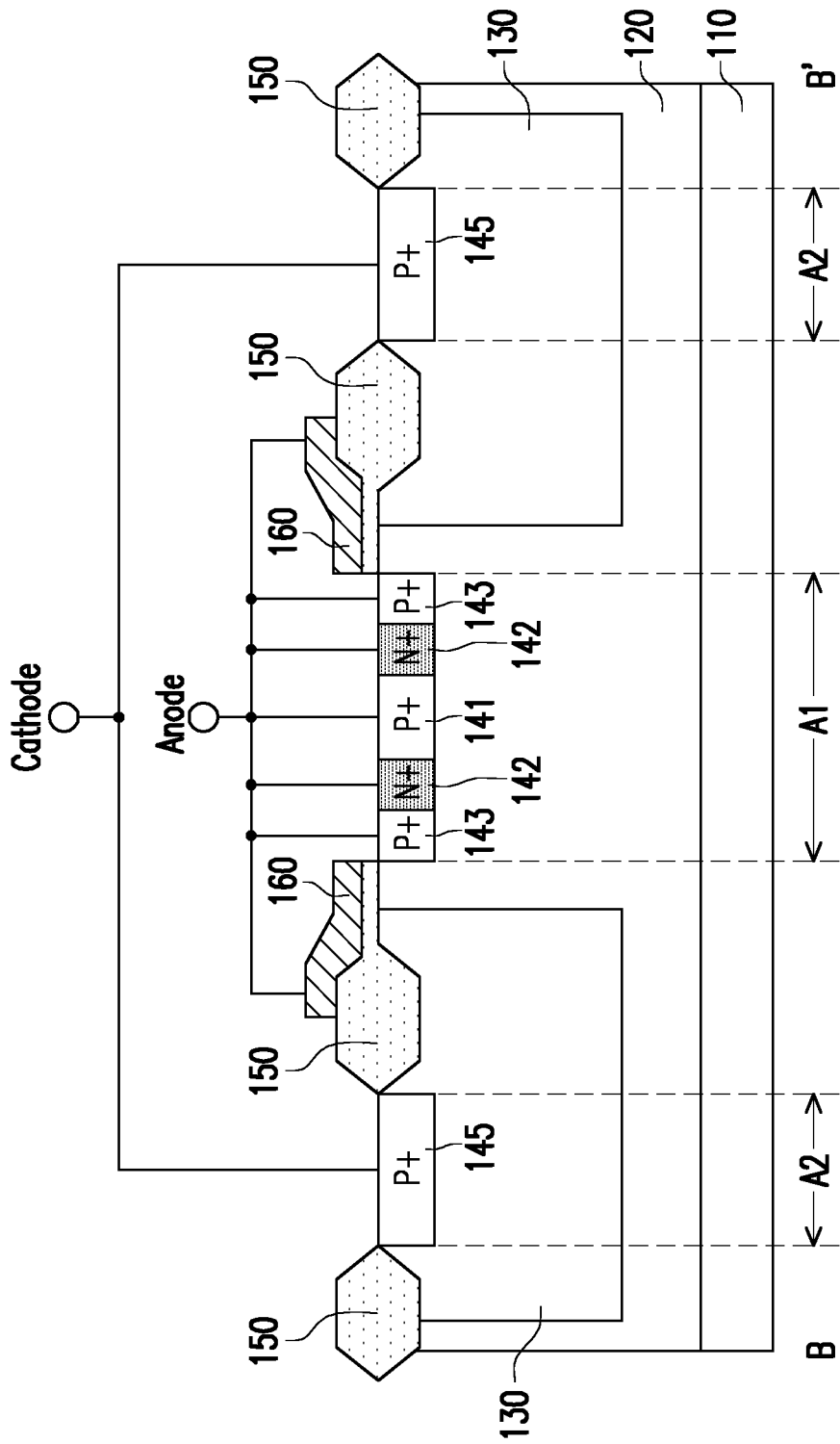
FIG. 3 is a cross section shown along section line B-B' of FIG. 1.

FIG. 1 is a simplified top view of an electrostatic protection circuit shown according to an embodiment of the invention. FIG. 2 is a cross section shown along section line A-A' of FIG. 1. FIG. 3 is a cross section shown along section line B-B' of FIG. 1.

Please refer to all of FIG. 1, FIG. 2, and FIG. 3. In an embodiment, an electrostatic discharge protection device 10 includes a substrate 110, a high-voltage N-well region 120, a high-voltage P-well region 130, a first doped region 141, a second doped region 142, a third doped region 143, fourth doped regions 144, a fifth doped region 145, a field-oxide region 150, and a polysilicon region 160.

In an embodiment, the substrate 110 is a P-type silicon substrate having the first conductivity type. The substrate 110 has a first area A1 and a second area A2, and the second area A2 surrounds the first area A1 as shown in FIG. 1. In another embodiment, the substrate may also be a P-epi.

In an embodiment, the high-voltage N-well region 120 is disposed on the substrate 110, and the high-voltage P-well region 130 is disposed on the high-voltage N-well region 120. In an embodiment, the high-voltage N-well region 120 is a doped region having the second conductivity type, and the high-voltage P-well region 130 is a doped region having the first conductivity type. In an embodiment, the high-voltage N-well region 120 may be formed by an N-epi layer, a single N+ buried layer or multiple N+ buried layers. The high-voltage P-well region 130 may be a P-type well, a P+ buried layer, or a P− implant.

The first area A1 is disposed on the high-voltage N-well region 120. The first area A1 includes the first doped region 141, the second doped region 142, and the third doped region 143. Referring to FIG. 1, the first doped region 141 is a high-concentration doped region having the first conductivity type (P+). The second doped region 142 is a high-concentration doped region having the second conductivity type (N+), and the second doped region 142 surrounds the first doped region 141. The third doped region 143 is a high-concentration doped region having the first conductivity type (P+), and the third doped region 143 surrounds the second doped region 142. Referring to FIG. 2 and FIG. 3, the first doped region 141, the second doped region 142, and the third doped region 143 are electrically connected to an anode.

The second area A2 is disposed on the high-voltage P-well region 130. The second area A2 includes the plurality of fourth doped regions 144 and the fifth doped region 145. Referring to FIG. 1, the plurality of fourth doped regions 144 are high-concentration doped regions having the second conductivity type (N+), and the plurality of fourth doped regions 144 are arranged at intervals and surround the first area A1. The plurality of fourth doped regions 144 have the same size. For example, the plurality of fourth doped regions 144 on the upper and lower sides of FIG. 1 have a same width a, and the plurality of fourth doped regions 144 on the left and right sides of FIG. 1 have a same width x. In an embodiment, the width a and the width x are, for example, 7.2 μm. In another embodiment, the width a may not be equal to the width x, depending on actual design requirements. The plurality of fourth doped regions 144 are arranged at equal intervals in the same arrangement direction. For example, the plurality of fourth doped regions on the upper and lower sides of FIG. 1 are arranged at intervals with a spacing c, and the plurality of fourth doped regions on the left and right sides of FIG. 1 are arranged at intervals with a spacing z. In an embodiment, the spacing c and the spacing z are, for example, 1.2 μm. In another embodiment, the spacing c may not be equal to the spacing z, depending on actual design requirements. In addition, although FIG. 1 has four fourth doped regions 144 on each of the upper and lower sides and eight fourth doped regions 144 on each of the left and right sides, the invention does not limit the actual configuration of the plurality of fourth doped regions 144, which depends on actual design requirements. The fifth doped region 145 is a high-concentration doped region having the first conductivity type (P+). The fifth doped region 145 surrounds the first area A1, and the fifth doped region 145 also surrounds each of the plurality of fourth doped regions 144. Referring to FIG. 2 and FIG. 3, the fourth doped regions 144 and the fifth doped region 145 are electrically connected to a cathode.

It should be noted that the difference between FIG. 2 and FIG. 3 is that section line A-A' includes the plurality of fourth doped regions 144 and the fifth doped region 145 on the upper and lower sides of FIG. 1, and section line B-B' only includes the fifth doped region 145 on the upper and lower sides. In addition, the first doped region 141, the second doped region 142, the third doped region 143, the fourth doped regions 144, and the fifth doped region 145 are high-concentration doped regions as described above, meaning the doping concentrations thereof are higher than the doping concentrations of the substrate 110, the high-voltage N-well region 120, and the high-voltage P-well region 130.

Referring to FIG. 2 and FIG. 3, the electrostatic discharge protection device 10 further includes a field-oxide region 150 and a polysilicon region 160. The field-oxide region 150 is disposed between the third doped region 143 and the fifth doped region 145. The polysilicon region 160 is disposed on the field-oxide region 150, and the polysilicon region 160 is electrically connected to the anode. The polysilicon may be manufactured by a single-poly process or a double-poly process. The invention is not limited thereto.

Figure 4:
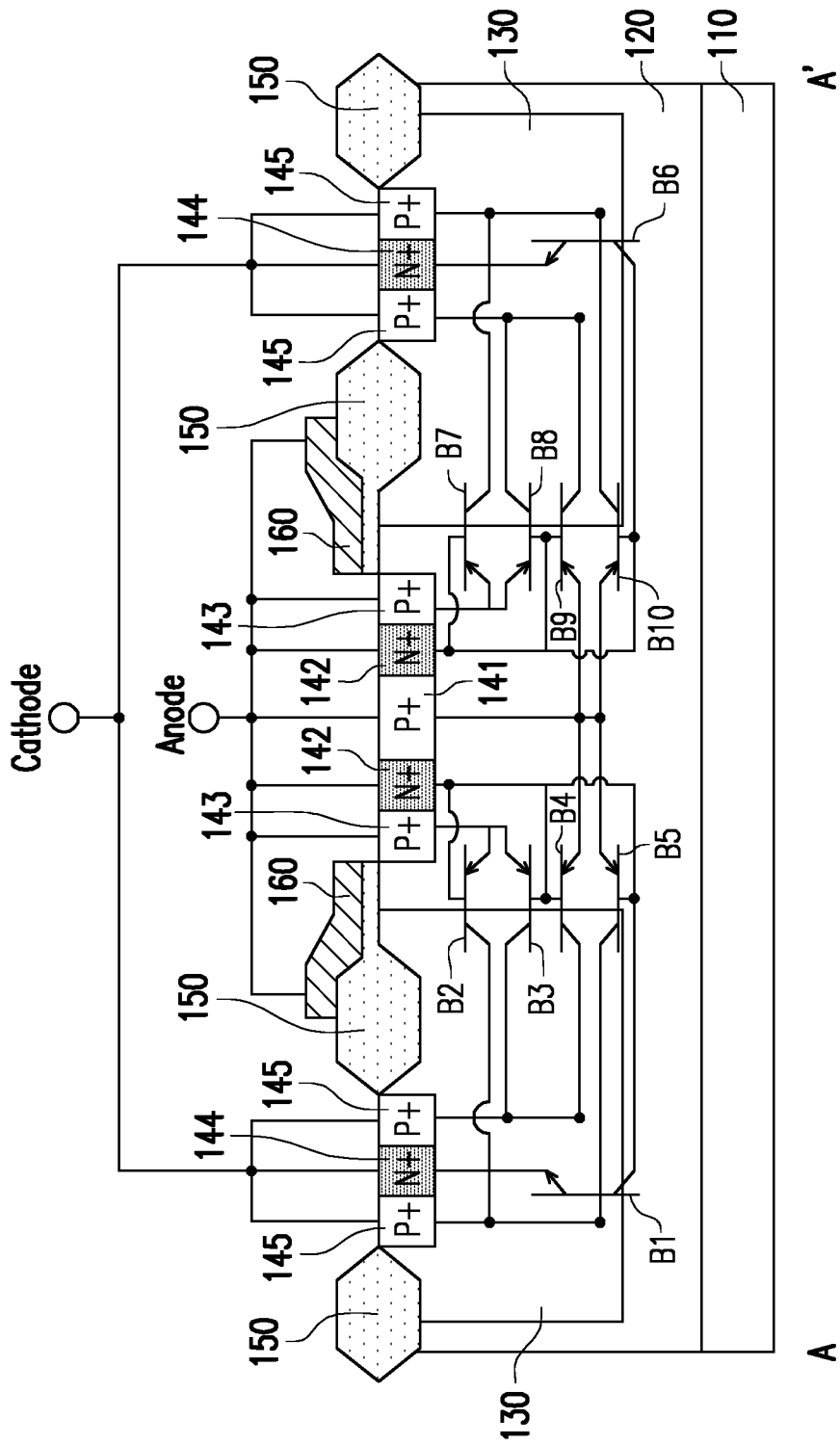
FIG. 4 is an equivalent circuit diagram of the cross section shown along section line A-A' of FIG. 1.

FIG. 4 is an equivalent circuit diagram of the cross section shown along section line A-A' of FIG. 1. FIG. 4 shows an equivalent circuit of the electrostatic discharge protection device 10 in section line A-A', and the equivalent circuit includes parasitic bipolar transistors B1 to B10. Taking the left side of FIG. 4 as an example, the second doped region 142 (N+), the high-voltage N-well region 120, the high-voltage P-well region 130, and the fourth doped region 144 (N+) form the parasitic bipolar transistor B1, wherein the parasitic bipolar transistor B1 belongs to an NPN transistor. The third doped region 143 (P+), the high-voltage N-well region 120, the high-voltage P-well region 130, and the fifth doped region 145 (P+) form the two parasitic bipolar transistors B2 and B3, wherein the parasitic bipolar transistors B2 and B3 belong to a PNP transistor. Referring to FIG. 1 and FIG. 4, the fifth doped region 145 includes portions away from an A1 side and close to the A1 side, the fifth doped region 145 away from the A1 side is the collector of the parasitic bipolar transistor B2, and the fifth doped region 145 close to the A1 side is the collector of the parasitic bipolar transistor B3. Similarly, the first doped region 141 (P+), the high-voltage N-well region 120, the high-voltage P-well region 130, and the fifth doped region 145 (P+) form the two parasitic bipolar transistors B4 and B5, wherein the parasitic bipolar transistors B4 and B5 belong to the PNP transistor. Referring to FIG. 1 and FIG. 4, the fifth doped region 145 includes portions away from the A1 side and close to the A1 side, the fifth doped region 145 close to the A1 side is the collector of the parasitic bipolar transistor B4, and the fifth doped region 145 away from the A1 side is the collector of the parasitic bipolar transistor B5. By analogy, the parasitic bipolar transistor B6 to B10 on the right side of FIG. 4 are described above and are not repeated herein.

Figure 5:
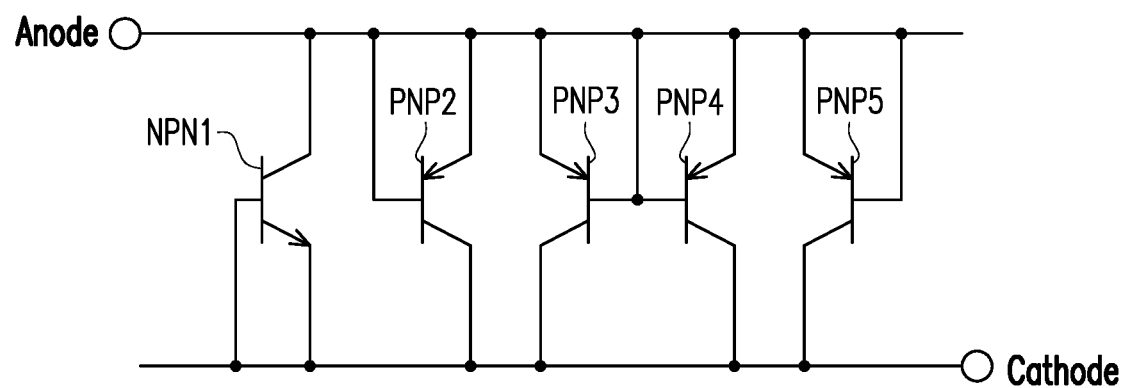
FIG. 5 is a simplified diagram of the equivalent circuit of FIG. 4.

FIG. 5 is a simplified diagram of the equivalent circuit of FIG. 4. Referring to FIG. 4 and FIG. 5 simultaneously, the parasitic bipolar transistor B1 and the parasitic bipolar transistor B6 may be equivalent to a parasitic bipolar transistor NPN1, and the parasitic bipolar transistors B2 to B5 and the parasitic bipolar transistors B7 to B10 may be equivalent to parasitic bipolar transistors PNP2 to PNP5. That is to say, the electrostatic discharge protection device 10 may be equivalent to an equivalent circuit including the parasitic bipolar transistor NPN1 and the parasitic bipolar transistors PNP2 to PNP5. In other words, when an electrostatic discharge source is provided from the anode to the cathode, the electrostatic discharge protection device 10 may discharge an electrostatic current by a plurality of electrostatic discharge paths generated after the parasitic bipolar transistor NPN1 and the parasitic bipolar transistors PNP2 to PNP5 are turned on. Compared with the prior art, the parasitic bipolar transistor NPN1 and the parasitic bipolar transistors PNP2 to PNP5 may further reduce the trigger voltage and the on-resistance of the electrostatic discharge protection device 10 and improve the protection capability against electrostatic discharge.

Figure 6:
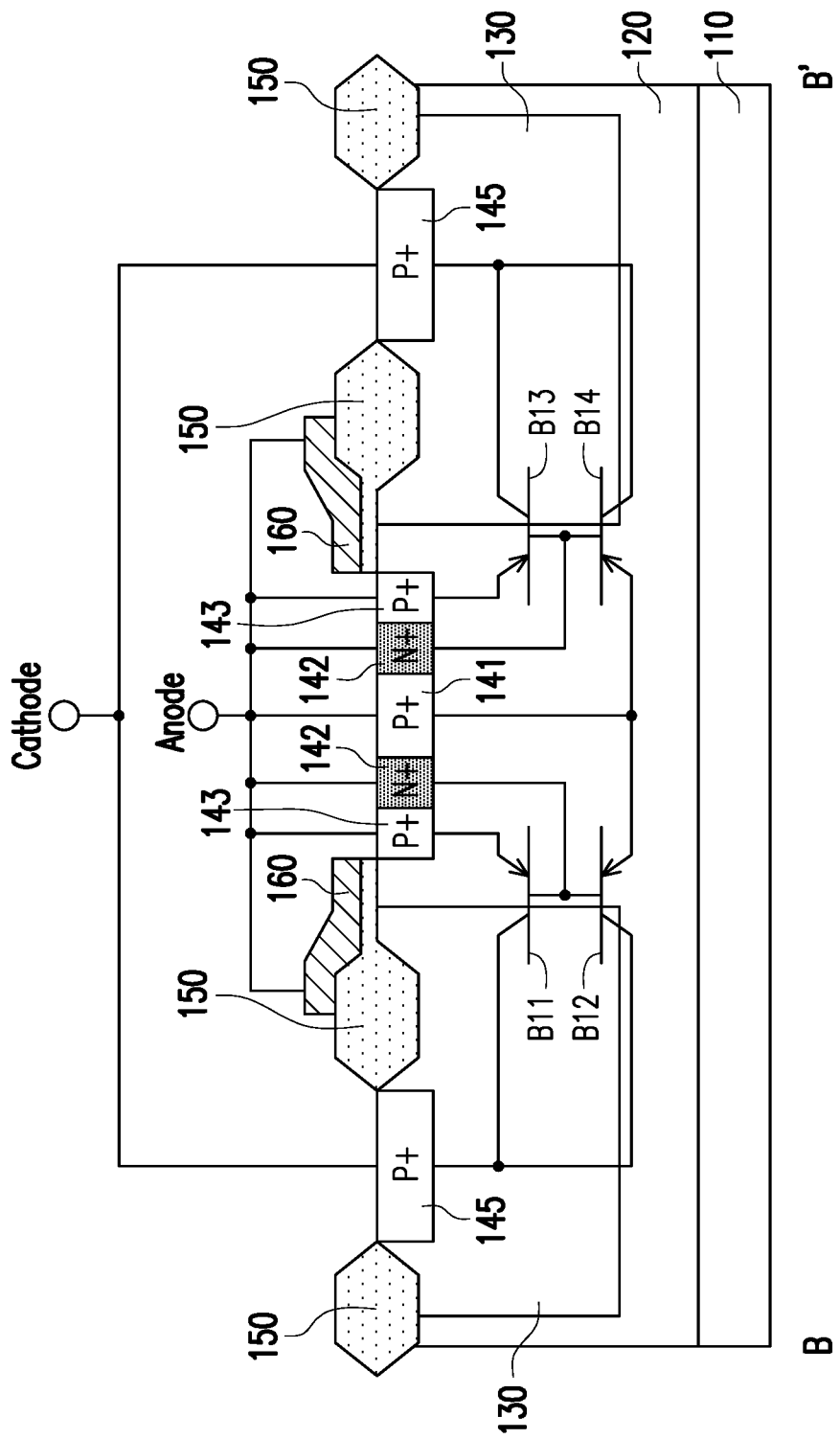
FIG. 6 is an equivalent circuit diagram of the cross section shown along section line B-B' of FIG. 1.

FIG. 6 is an equivalent circuit diagram of the cross section shown along section line B-B' of FIG. 1. Similar to FIG. 4, FIG. 6 shows an equivalent circuit of the electrostatic discharge protection device 10 in section line B-B'. Referring to FIG. 6, the equivalent circuit in section line B-B' includes parasitic bipolar transistors B11 to B14. Taking the left side of FIG. 6 as an example, the third doped region 143 (P+), the second doped region 142 (N+), the high-voltage N-well region 120, the high-voltage P-well region 130, and the fifth doped region 145 (P+) form the parasitic bipolar transistor B11. The first doped region 141 (P+), the second doped region 142 (N+), the high-voltage N-well region 120, the high-voltage P-well region 130, and the fifth doped region 145 (P+) form the parasitic bipolar transistor B12, wherein the parasitic bipolar transistors B11 and B12 belong to the PNP transistor. By analogy, the parasitic bipolar transistor B13 to B14 on the right side of FIG. 4 are described above and are not repeated herein.

Based on the above, the invention provides an electrostatic discharge protection device having a low trigger voltage. An N+ doped region and a P+ doped region having a ring structure are disposed outside the P+ doped region in the high-voltage N-well region, and a plurality of the N+ doped region surrounded by the P+ doped region and arranged at intervals are disposed in the high-voltage P-well region surrounding the high-voltage N-well region to provide a plurality of parasitic bipolar transistors in an electrostatic discharge path, thus further reducing the trigger voltage of the electrostatic discharge protection device and improving the electrostatic discharge protection capability.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electrostatic discharge protection device, comprising:
   a substrate having a first area and a second area, wherein the second area surrounds the first area, and the substrate has a first conductivity type;
   a high-voltage N-well region having a second conductivity type and disposed on the substrate; and
   a high-voltage P-well region having the first conductivity type and disposed on the high-voltage N-well region;
   wherein the first area is disposed on the high-voltage N-well region and comprises:
   a first doped region having the first conductivity type;
   a second doped region having the second conductivity type and surrounding the first doped region; and
   a third doped region having the first conductivity type and surrounding the second doped region,
   wherein the second area is disposed on the high-voltage P-well region and comprises:
   a plurality of fourth doped regions having the second conductivity type, wherein the plurality of fourth doped regions are arranged at intervals and surround the first area; and
   a fifth doped region having the first conductivity type, wherein the fifth doped region surrounds the first area and each of the plurality of fourth doped regions.

2. The electrostatic discharge protection device of claim 1, wherein the plurality of fourth doped regions have a same size.

3. The electrostatic discharge protection device of claim 1, wherein the plurality of fourth doped regions have a same interval distance in a same arrangement direction.

4. The electrostatic discharge protection device of claim 1, wherein the first doped region, the second doped region, and the third doped region are electrically connected to an anode, and the plurality of fourth doped regions and the fifth doped region are electrically connected to a cathode.

5. The electrostatic discharge protection device of claim 1, further comprising:
   a field-oxide region disposed between the third doped region and the fifth doped region; and
   a polysilicon region disposed on the field-oxide region, wherein the polysilicon region is electrically connected to an anode.

6. The electrostatic discharge protection device of claim 5, wherein the polysilicon region is a single polysilicon or a double polysilicon.

7. The electrostatic discharge protection device of claim 1, wherein the substrate is a P-type silicon substrate or a P-epi.

8. The electrostatic discharge protection device of claim 1, wherein the high-voltage N-well region is formed by an N-epi, a single N+ buried layer or multiple N+ buried layers, and the high-voltage P-well region is a P-type well, a P+ buried layer, or a P− implant.

9. The electrostatic discharge protection device of claim 1, wherein the first conductivity type is electrically opposite to the second conductivity type.

10. The electrostatic discharge protection element of claim 1, wherein doping concentrations of the first doped region, the second doped region, the third doped region, the plurality of fourth doped regions, and the fifth doped region are higher than doping concentrations of the substrate, the high-voltage N-well region, and the high-voltage P-well region.

* * * * *